United States Patent [19]

Voigt et al.

[11] Patent Number: 5,028,885
[45] Date of Patent: Jul. 2, 1991

[54] PHASE-LOCKED LOOP SIGNAL GENERATION SYSTEM WITH CONTROL MAINTENANCE

[75] Inventors: John Voigt, Palatine; Tom Kundmann, Streamwood, both of Ill.

[73] Assignee: Motorola, Inc., Schaumburg, Ill.

[21] Appl. No.: 574,853

[22] Filed: Aug. 30, 1990

[51] Int. Cl.$^5$ .................. H03L 7/085; H04B 1/38
[52] U.S. Cl. ..................... 331/1 A; 331/14; 331/17; 331/25; 331/DIG. 2; 375/120; 455/76; 455/119; 455/260
[58] Field of Search ............. 331/1 A, 14, 17, 25, 331/DIG. 2; 455/75, 76, 119, 183, 260; 375/120

[56] References Cited

U.S. PATENT DOCUMENTS

| | | | |
|---|---|---|---|
| 4,107,623 | 8/1978 | Graf et al. | 331/1 A |
| 4,135,166 | 1/1979 | Marchetti | 331/17 X |
| 4,494,079 | 1/1985 | Light, Jr. et al. | 331/1 A |
| 4,673,892 | 6/1987 | Miyashita et al. | 331/14 |

Primary Examiner—Siegfried H. Grimm
Attorney, Agent, or Firm—Raymond A. Jenski; Rolland R. Hackbart; Steven G. Parmelee

[57] ABSTRACT

A phase-locked loop system having as input a stable refernce clock signal and outputting a master clock signal. The phase of the stable reference clock signal is compared to that of the pre-scaled master clock signal and the difference represented by an analog error signal which is converted to a digital signal by an A/D converter (116). The digital signal is then transformed into an analog control signal by a D/A converter (120) and applied to a VCO (128) which generates the master clock signal, If the stable reference clock signal has degraded or is lost the A/D converter (116), which receives its sampling clock in part from the stable reference clock signal, stops sampling and thus stops producing digital signals. The last good digital signal is maintained, the last good analog control signal is maintained and thus the master clock signal is maintained.

21 Claims, 1 Drawing Sheet

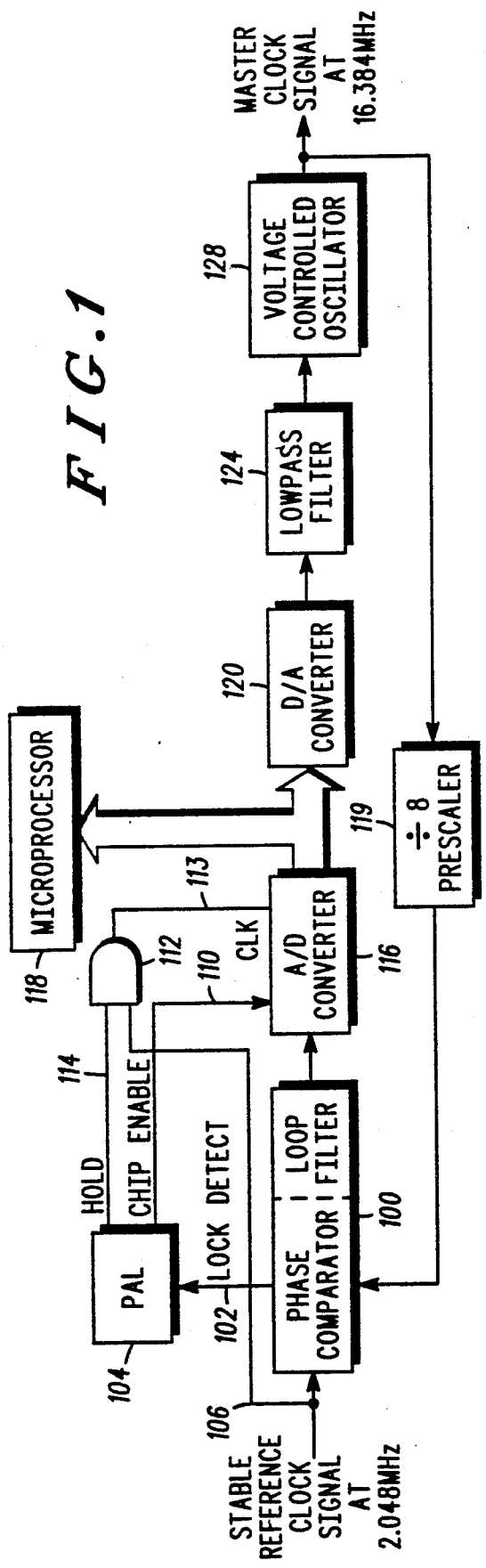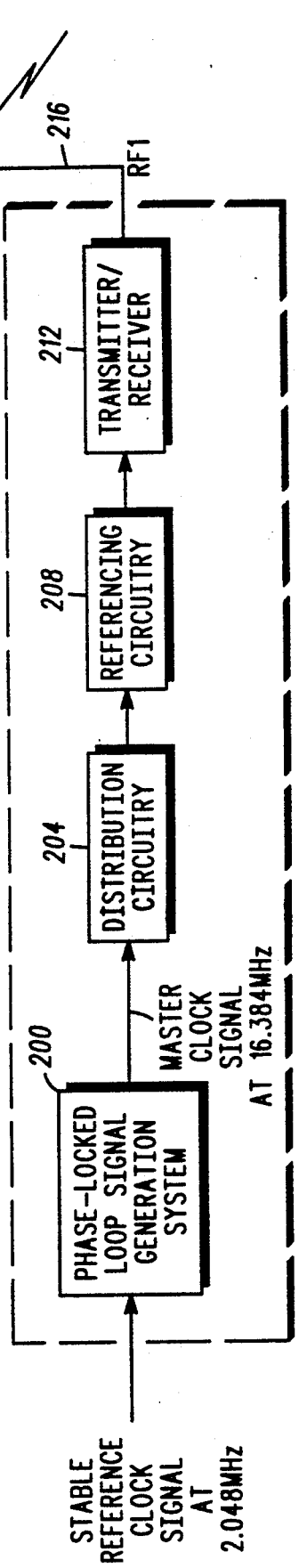

PHASE-LOCKED LOOP SIGNAL GENERATION SYSTEM WITH CONTROL MAINTENANCE

TECHNICAL FIELD OF THE INVENTION

The invention relates generally to the generation of stable clock signals and more particularly to RF cellular communication systems employing phase-locked loops for stable signal synthesis.

BACKGROUND OF THE INVENTION

In RF digital cellular radio telephone systems, high stability frequency sources are necessary to obtain quality and reliable digital transmissions. The master clock signal used by digital cellular base-stations for synchronization is normally synthesized from an internal oscillator which is typically phase locked to a reference clock signal. In this configuration, the master clock signal directly tracks the reference clock signal, thus the characteristics of the master clock signal are dependent on the characteristics of the reference clock signal. If the reference clock signal is lost, the phase comparator section of the phase-locked loop produces a large phase error signal which is directly applied as a control signal to the internal oscillator. This large phase error signal causes the oscillator to drift off frequency and produce an incorrect master clock signal. Since the base-station relies on a stable master clock signal for accurate synchronization, the quality of communication from the base-station to corresponding equipment is seriously degraded.

Synchronization problems also arise when the reference clock signal is present but does not meet the system requirement for stability. If the reference clock signal drifts outside of the specified stability limits, typical phase-locked loops will produce a master clock signal that is likewise outside of the specified stability limits. If the system has no provision for monitoring the reference clock signal for drift, accurate synchronization will not be maintained and the quality of communication from the base-station to corresponding equipment will again be seriously degraded.

Thus, a need exists for a phase-locked loop system which maintains a master clock signal when the corresponding stable reference clock signal has been lost or has drifted out of specified stability limits while maintaining typical phase-locked loop characteristics.

SUMMARY OF THE INVENTION

The present invention encompasses an apparatus for maintaining a master clock signal in the event a stable reference clock signal has degraded. A stable reference clock signal and a generated master clock signal are coupled to produce an analog error signal. The analog error signal is converted to a digital signal which is transformed to an analog control signal and coupled to the master clock signal generator. If the stable reference clock signal has degraded, the converter is disabled and the digital signal is maintained.

BRIEF DESCRIPTION OF THE DRAWINGS

FIG. 1 depicts one embodiment implementing control maintenance in a phase-locked loop signal generation system in accordance with the invention.

FIG. 2 generally illustrates a digital radiotelephone system employing a phase-locked loop signal generation system with control maintenance in accordance with the invention.

DETAILED DESCRIPTION OF THE PREFERRED EMBODIMENT

FIG. 1 illustrates the preferred embodiment of the present invention. In the case where the input reference clock signal is stable and present, a conventional phase comparator/loop filter 100 has as input a reference clock signal at a frequency of 2.048 MHz and the output from a conventional voltage controlled oscillator (VCO) 128, which is also the master clock signal of the present invention. The output frequency of the VCO is 16.384 MHz or 8 times that of the reference clock signal, thus a divide by 8 pre-scaler 119 at the output of the VCO 128 is required to make phase comparison of the two signals possible.

The phase comparator/loop filter 100 measures the phase difference between the pre-scaled master clock signal and the stable reference clock signal and produces an analog error signal corresponding to the difference. The analog error signal is input into a conventional 8-bit analog to digital (A/D) converter 116 having as input a CHIP ENABLE line 110 and a CLK line 113. The CLK line is the output of an AND gate 112 which has as input the stable reference clock signal and a HOLD line 114. The CHIP ENABLE line 110 and the HOLD line 114 are outputs from a conventional programmable array of logic (PAL) 104 which is coupled to the phase comparator/loop filter 100 through a LOCK DETECT line 102. As long as the stable reference clock signal is present, the LOCK DETECT line 102 and the HOLD line 114 are high and the A/D converter 116 is allowed to sample the analog error signal.

Output of the A/D converter 116 is a 8-bit digital signal. This 8-bit digital signal is monitored by a Motorola 68030 microprocessor 118 and is input into a conventional digital to analog (D/A) converter 120 where it is transformed into an analog control signal. The analog control signal passes through a low pass filter 124 and is applied as a control signal to the VCO 128. The control signal applied to the VCO 128 increases/decreases the output frequency of the VCO 128 as required to keep the LOCK DETECT line 102 from the phase comparator/loop filter 100 high and thus maintain the lock condition.

When the stable reference clock signal is lost, the A/D converter 116 automatically stops sampling the analog error signal. The phase comparator/loop filter 100 becomes unlocked, the LOCK DETECT line 102 from the phase comparator/loop filter 100 goes low and the PAL 104 in turn pulls the HOLD line 114 low to prevent further clocking. Since the D/A converter 120 no longer receives a new 8-bit digital signal, the last good 8-bit digital signal is maintained, the corresponding last good control signal applied to the VCO 128 is maintained and consequently the last master clock signal is maintained.

To enable the A/D converter 116 to sample again, the stable reference clock signal needs to be present and the PAL 104 needs to verify certain system redundancy parameters. When these two conditions are met, the PAL 104 sets the HOLD line 114 high, enabling the A/D converter 116 to start sampling the analog error signal and generating 8-bit digital signals. The last good 8-bit digital signal that was maintained when the stable reference clock signal was lost is now updated. The D/A converter 120 again transforms 8-bit digital signals to analog control signals which are filtered and applied to the VCO 128, increasing/decreasing the VCO output frequency as necessary to re-acquire lock. After a necessary lock time has elapsed, the phase comparator/loop filter 100 will re-acquire lock and pull the LOCK DETECT line 102 high.

The system of FIG. 1 also has the capability to monitor degradation of the stable reference clock signal. If the stable reference clock signal is present and the phase comparator is locked, the A/D converter 116 is taking samples and converting analog phase error signals to 8-bit digital signals. The microprocessor 118 can monitor the digital signals that are generated and can be programmed such that when a digital signal corresponding to a degraded (completely lost or outside of the 0.05 parts per million system stability limit perhaps) stable reference clock signal is produced, the microprocessor 118 may either let the A/D converter 116 continue to sample or disable the A/D converter 116. If the microprocessor 118 decides to disable the A/D converter 116, it can output a programmed known good 8-bit digital signal to the D/A converter 120 or maintain the last good 8-bit digital signal. In this way, a master clock signal can be maintained even in the presence of a degraded stable reference clock signal.

FIG. 2 generally depicts a typical use of the present invention in a digital radiotelephone system. The phase-locked loop signal generation system 200 receives the stable reference clock signal and generates a master clock signal. The master clock signal is distributed throughout the system by distribution circuitry 204 and is used as a reference by referencing circuitry 208. The reference circuitry 208 is coupled to a transmitter/receiver 212 which transmits and receives radio frequency signal compatible to the digital radiotelephone system using antenna RF1 216. Since the transmitter/receiver 212 uses the master clock signal as a reference for transmission and reception, it is necessary to maintain the master clock signal. If the stable reference clock signal is lost or has degraded, the phase-locked loop signal generation system system 200 will maintain the master clock signal and thus transmission and reception of RF signals is sustained.

What we claim is:

1. A phase-locked loop signal generation system having a stable reference clock signal input and outputting a master clock signal comprising:

means for generating the master clock signal;
means, coupled to the master clock signal and the stable reference clock signal, for producing an analog error signal;
means, coupled to said means for producing and the stable reference clock signal, for converting said analog error signal to a digital signal;
means, coupled to said means for converting, for transforming said digital signal to an analog control signal for coupling to said means for generating the master clock signal;
means, coupled to said means for producing and said means for converting, for disabling said means for converting when the stable reference clock signal has degraded; and
means for maintaining said digital signal when the stable reference clock signal has degraded.

2. The phase-locked loop signal generation system of claim 1 wherein said means for generating the master clock signal further comprises a voltage controlled oscillator.

3. The phase-locked loop signal generation system of 1 wherein said means for disabling further comprises means for determining when the stable reference clock signal has degraded.

4. The phase-locked loop signal generation system of claim 1 wherein said means for producing further comprises means for generating an un-lock signal when the stable reference clock signal has degraded.

5. The phase-locked loop signal generation system of claim 1 wherein said means for producing further comprises means for generating a lock signal when the stable reference clock signal is present.

6. The phase-locked loop signal generation system of claim 1 wherein said means for disabling further comprises means for enabling.

7. The phase-locked loop signal generation system of claim 6 wherein said means for enabling enables said means for converting when the stable reference clock signal is present.

8. A digital radiotelephone system incorporating a phase-locked loop signal generation system having a stable reference clock signal input and outputting a master clock signal comprising:

means for generating the master clock signal;
means, coupled to the master clock signal and the stable reference clock signal, for producing an analog error signal;
means, coupled to said means for producing and the stable reference clock signal, for converting said analog error signal to a digital signal;
means, coupled to said means for converting, for transforming said digital signal to an analog control signal for coupling to said means for generating the master clock signal;
means, coupled to said means for generating the master clock signal, for distributing the master clock signal;
means, coupled to said means for distributing, for referencing to said master clock signal; and
means, coupled to said means for referencing, for transmitting at least one radio frequency signal compatible to the digital radiotelephone system.

9. The digital radiotelephone system of claim 8 wherein said means for transmitting further comprises means for sustaining transmission of said at least one transmit radio frequency signal when the stable reference clock signal has degraded.

10. A digital radiotelephone system incorporating a phase-locked loop signal generation system having a stable reference clock signal input and outputting a master clock signal comprising:

means for generating the master clock signal;
means, coupled to the master clock signal and the stable reference clock signal, for producing an analog error signal;
means, coupled to said means for producing and the stable reference clock signal, for converting said analog error signal to a digital signal;
means, coupled to said means for converting, for transforming said digital signal to an analog control signal for coupling to said means for generating the master clock signal;
means, coupled to said means for generating the master clock signal, for distributing the master clock signal;

means, coupled to said means for distributing, for referencing to said master clock signal; and means, coupled to said means for referencing, for receiving at least one radio frequency signal compatible to the digital radiotelephone system.

11. The digital radiotelephone system of claim 10 wherein said means for receiving further comprises means for sustaining reception of said at least one receive radio frequency signal when the stable reference clock signal has degraded.

12. A method of stable signal generation in a phase-locked loop system having a stable reference clock signal input and outputting a master clock signal comprising the steps of:
   generating the master clock signal;
   producing an analog error signal from the master clock signal and the stable reference clock signal;
   converting said analog error signal to a digital signal;
   transforming said digital signal to an analog control signal for coupling to the master clock signal generator;
   disabling said step of converting when the stable reference clock signal has degraded; and
   maintaining said digital signal when the reference clock signal has degraded.

13. The method of claim 12 wherein said step of disabling further comprises the step of determining when the stable reference clock signal has degraded.

14. The method of claim 12 wherein said step of producing further comprises the step of generating an unlock signal when the stable reference clock signal has degraded.

15. The method of claim 12 wherein said step of producing further comprises the step of generating a lock signal when the stable reference clock signal is present.

16. The method of claim 12 wherein said step of disabling further comprises the step of enabling.

17. The method of claim 16 wherein said step of enabling enables said step of converting when the stable reference clock signal is present.

18. A method of radio frequency signal communication in a digital radiotelephone system incorporating a phase-locked loop signal generation system having a stable reference clock signal input and outputting a master clock signal comprising the steps of:
   generating the master clock signal;
   producing an analog error signal from the master clock signal and the stable reference clock signal;
   converting said analog error signal to a digital signal;
   transforming said digital signal to an analog control signal for coupling to the master clock signal generator;
   distributing the master clock signal;
   referencing to the distributed master clock signal; and
   transmitting, employing the master clock signal as a reference, at least one radio frequency signal compatible to the digital radiotelephone system.

19. The method of claim 18 wherein said step of transmitting further comprises the step of sustaining transmission of said at least one radio frequency signal when the stable reference clock signal has degraded.

20. A method of radio frequency signal communication in a digital radiotelephone system incorporating a phase-locked loop signal generation system having a stable reference clock signal input and outputting a master clock signal comprising the steps of:
   generating the master clock signal;
   producing an analog error signal from the master clock signal and the stable reference clock signal;
   converting said analog error signal to a digital signal;
   transforming said digital signal to an analog control signal for coupling to the master clock signal generator;
   distributing the master clock signal;
   referencing to the distributed master clock signal; and
   receiving, employing the master clock signal as a reference, at least one radio frequency signal compatible to the digital radiotelephone system.

21. The method of claim 20 wherein said step of receiving further comprises the step of sustaining reception of said at least one receive radio frequency signal when the stable reference clock signal has degraded.

* * * * *